(12) United States Patent
Choi et al.

(10) Patent No.: US 7,816,255 B2
(45) Date of Patent: Oct. 19, 2010

(54) METHODS OF FORMING A SEMICONDUCTOR DEVICE INCLUDING A DIFFUSION BARRIER FILM

(75) Inventors: Kyung-In Choi, Seoul (KR); Gil-Heyun Choi, Seoul (KR); Hyun-Bae Lee, Seoul (KR); Jong-Won Hong, Gyeonggi-do (KR); Jong-Myeong Lee, Gyeonggi-do (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 31 days.

(21) Appl. No.: 12/112,135

(22) Filed: Apr. 30, 2008

(65) Prior Publication Data

US 2008/0274610 A1 Nov. 6, 2008

(30) Foreign Application Priority Data

May 3, 2007 (KR) .......................... 2007-0043153

(51) Int. Cl.
*H01L 21/4763* (2006.01)
*H01L 23/48* (2006.01)
(52) U.S. Cl. ...................... 438/627; 438/643; 438/653; 257/751; 257/767
(58) Field of Classification Search ................ 438/627, 438/643, 653; 257/751, 767
See application file for complete search history.

(56) References Cited

U.S. PATENT DOCUMENTS

| 5,552,341 A * | 9/1996 | Lee .............................. 438/643 |
| 5,909,637 A * | 6/1999 | Charneski et al. ........... 438/687 |
| 6,271,136 B1 * | 8/2001 | Shue et al. .................. 438/687 |
| 6,958,291 B2 * | 10/2005 | Yu et al. ...................... 438/637 |
| 2002/0134686 A1 * | 9/2002 | Kobayashi et al. .......... 205/186 |
| 2007/0059925 A1 * | 3/2007 | Choi et al. .................. 438/640 |

FOREIGN PATENT DOCUMENTS

| JP | 2001-274162 | 10/2001 |
| KR | 1020050009352 A | 1/2005 |
| KR | 1020050023043 A | 3/2005 |
| KR | 1020050122638 A | 12/2005 |

\* cited by examiner

*Primary Examiner*—Ha Tran T Nguyen
*Assistant Examiner*—Aaron A Dehne
(74) *Attorney, Agent, or Firm*—Myers Bigel Sibley & Sajovec, P.A.

(57) ABSTRACT

Methods of forming a semiconductor device that includes a diffusion barrier film are provided. The diffusion barrier film includes a metal nitride formed by using a MOCVD process and partially treated with a plasma treatment. Thus, a specific resistance of the diffusion barrier film can be decreased, and the diffusion barrier film may have distinguished barrier characteristics.

7 Claims, 11 Drawing Sheets

US 7,816,255 B2

METHODS OF FORMING A SEMICONDUCTOR DEVICE INCLUDING A DIFFUSION BARRIER FILM

CROSS-REFERENCE TO RELATED APPLICATION

This U.S. non-provisional patent application claims priority under 35 U.S.C §119 to Korean Patent Application No. 2007-0043153 filed on May 3, 2007, the entirety of which is hereby incorporated herein by reference.

BACKGROUND

The present invention is directed to methods of forming a semiconductor device, and, more particularly, to methods of forming a semiconductor device including a diffusion barrier film.

As semiconductor devices become more highly integrated, semiconductor patterns of a semiconductor device (especially width and thickness of interconnections) may decrease. Thus, the electrical resistance value of the interconnections may increase. As the semiconductor industry develops, a faster operation speed of semiconductor devices is in demand. To satisfy such high integration and faster operation speed, the interconnections may be formed of a conductive material of low specific resistance.

Interconnections of the semiconductor device and/or pads electrically connected to the exterior may be mostly made of aluminum. However, as described above, interconnections and/or pads made of copper having a lower specific resistance than aluminum may be used, as higher integration and a faster operation speed is demanded.

However, a number of problems may occur when the interconnections and/or pads are made of copper. For example, copper may be easily oxidized. When a pad is made of copper, a copper oxide layer may be formed on a surface of the pad, which may cause poor contact between the pad and an external terminal (e.g. wire bonding). Accordingly, a copper pattern and an aluminum pattern may be used together in a semiconductor device. For example, lower interconnections may be made of a copper pattern, and final interconnections and pads of the semiconductor device may be made of aluminum patterns. However, problems may also occur in this case. Copper atoms in the copper pattern and aluminum atoms in the aluminum pattern may be mutually diffused to generate a copper-aluminum alloy. The copper-aluminum alloy has a significantly higher specific resistance than copper and/or aluminum individually. Therefore, the electrical characteristics of the semiconductor device may be degraded.

SUMMARY

Exemplary embodiments of the present invention are related to methods of forming a semiconductor device including a diffusion barrier film. In an exemplary embodiment, a method of forming a semiconductor device may include: forming an interlayer dielectric on a substrate that includes a lower conductor; forming an opening that penetrates the interlayer dielectric and exposes the lower conductor; forming a diffusion barrier film on the substrate including the opening, the diffusion barrier film including a plasma-treated layer and a plasma-untreated layer; and forming an upper conductor on the diffusion barrier film to fill the opening, wherein the diffusion barrier film includes a metal nitride formed by using a metal organic chemical vapor deposition (MOCVD) process.

BRIEF DESCRIPTION OF THE DRAWINGS

The above and other features and advantages of the present invention will become apparent by describing in detail exemplary embodiments thereof with reference to the attached drawings in which.

DETAILED DESCRIPTION OF EMBODIMENTS

Figure 1:
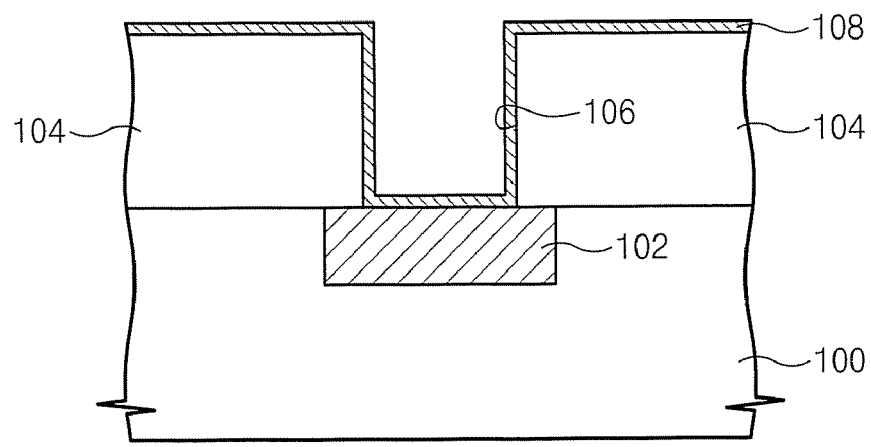
FIG. 1 to FIG. 4 are cross-sectional views illustrating methods of forming a semiconductor device according to some embodiments of the present invention.

The invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like reference numerals refer to like elements throughout the description of the figures.

It will be understood that when an element is referred to as being "on" another element, it can be directly on the other element or intervening elements may be present. In contrast, when an element is referred to as being "directly on" another element, there are no intervening elements present. It will be understood that when an element is referred to as being "connected" or "coupled" to another element, it can be directly connected or coupled to the other element or intervening elements may be present. In contrast, when an element is referred to as being "directly connected or coupled" to another element, there are no intervening elements present. Furthermore, "connected" or "coupled" as used herein may include wirelessly connected or coupled. As used herein, the term "and/or" includes any and all combinations of one or more of the associated listed items.

It will be understood that, although the terms first, second, etc. may be used herein to describe various elements, these elements should not be limited by these terms. These terms are only used to distinguish one element from another. For example, a first layer could be termed a second layer, and, similarly, a second layer could be termed a first layer without departing from the teachings of the disclosure.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to other elements as illustrated in the Figures. It will be understood that relative terms are intended to encompass different orientations of the device in addition to the orientation depicted in the Figures. For example, if the device in one of the figures were turned over, elements described as being on the "lower" side of other elements would then be oriented on "upper" sides of the other elements. The exemplary term "lower", can therefore, encompass both an orientation of "lower" and "upper," depending of the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Embodiments of the present invention are described herein with reference to cross section illustrations that are schematic illustrations of idealized embodiments of the present invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present invention.

In the description, a term "substrate" used herein may include a structure based on a semiconductor, having a semiconductor surface exposed. It should be understood that such a structure may contain silicon, silicon on insulator, silicon on sapphire, doped or undoped silicon, epitaxial layer supported by a semiconductor substrate, or another structure of a semiconductor. And, the semiconductor may be silicon-germanium, germanium, or germanium arsenide, not limited to silicon. In addition, the substrate described hereinafter may be one in which regions, conductive layers, insulation layers, their patterns, and/or junctions are formed.

Exemplary Embodiment 1

FIG. 1 through FIG. 4 are cross-sectional views that illustrate a method of forming semiconductor device according to some embodiments of the present invention.

Referring to FIG. 1, a substrate 100 including a lower conductor 102 is provided. The lower conductor 102 may include at least one material selected from a group of copper and/or precious metals (for example, platinum, ruthenium, palladium, metal, silver iridium, osmium and rhodium, etc). The lower conductor 102 may be formed in an insulation layer using a damascene process. The lower conductor 102 may be line-shaped or pad-shaped.

An interlayer dielectric 104 is formed to cover an entire surface of the substrate 100 including the lower conductor 102. The interlayer dielectric 104 may include at least one material selected from oxide, nitride, oxynitride, and a low dielectric, the low dielectric having a lower dielectric constant than oxide (e.g. carbide or oxycarbide). The interlayer dielectric 104 is patterned to form an opening 106 exposing the lower conductor 102. The opening 106 may be formed in various ways. For example, the opening 106 may be hole-shaped or groove-shaped. Alternatively, the opening 106 may include a hole and a groove that are stacked sequentially.

A supplementary diffusion barrier layer 108 may be formed on the substrate 100 including the opening 106. The supplementary diffusion barrier layer 108 may be formed using a chemical vapor deposition process (CVD), a physical vapor deposition process (PVD), or an atomic layer deposition process (ALD). The supplementary diffusion barrier layer 108 may include at least one material selected from a group of titanium, tantalum, titanium nitride, tantalum nitride, titanium-zirconium and titanium-zirconium nitride. The supplementary diffusion barrier layer 108 may be omitted.

Figure 2:
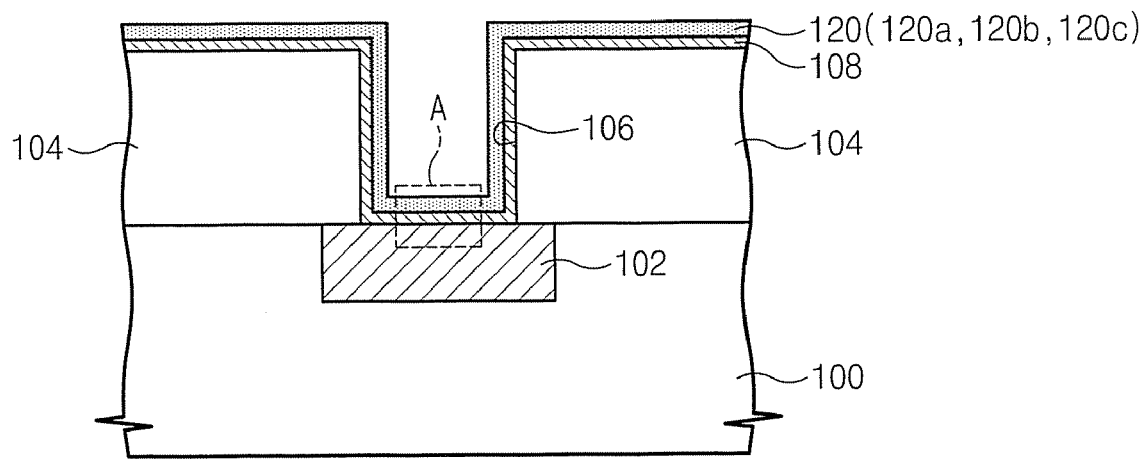

Referring to FIG. 2, a diffusion barrier film 102 is formed on a supplementary diffusion barrier layer 108. The diffusion barrier film 120 may be made of metal nitride using a metal organic chemical vapor deposition process (MOCVD process). Particularly, the diffusion barrier film 120 may be made of metal nitride including refractory metal. For example, the diffusion barrier film 120 may include at least one material selected from a group of niobium, vanadium, tantalum, titanium, zirconium, hafnium, molybdenum, rhenium, tungsten, titanium-silicon, tantalum-silicon and titanium-zirconium. The diffusion barrier film 120 includes a layer treated with a plasma (plasma-treated layer, hereinafter) and a layer not treated with a plasma (plasma-untreated layer, hereinafter).

A method of forming the diffusion barrier film 120, according to some embodiments of the present invention, will be described in detail with reference to the flow chart of FIG. 5, and the cross-sectional views of FIG. 6a and FIG. 6b.

Figure 5:
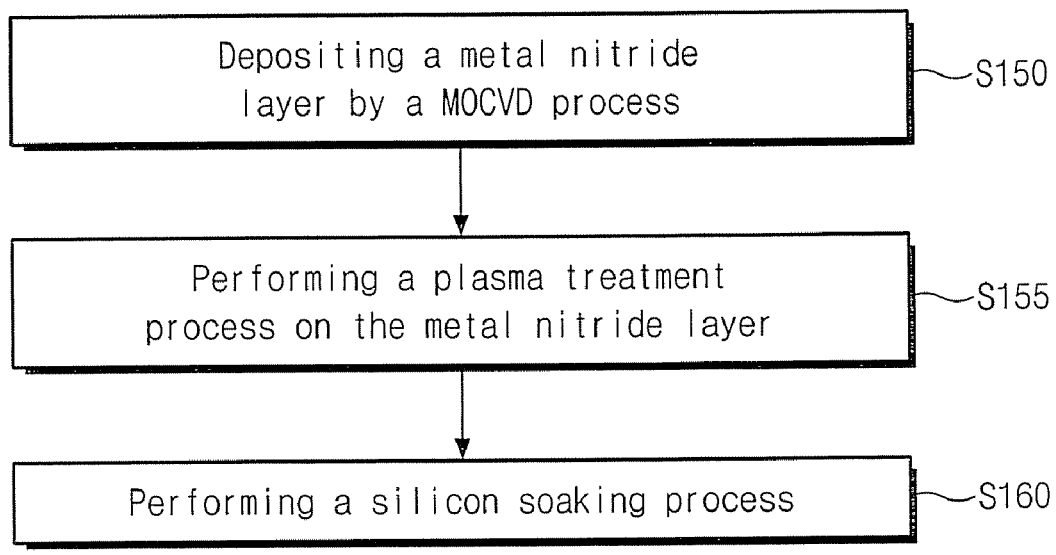
FIG. 5 is a flow chart illustrating a method of forming a diffusion barrier film in a method of forming a semiconductor device according to some embodiments of the present invention.

FIG. 5 is a flow chart that illustrates a method of forming a diffusion barrier film in a method of forming semiconductor device according to some embodiments of the present invention. FIG. 6a and FIG. 6b are enlarged cross-sectional views of a portion A of FIG. 2 that illustrate the method of forming the diffusion barrier film in the method of forming a semiconductor device according to some embodiments of the present invention.

Figure 6A:
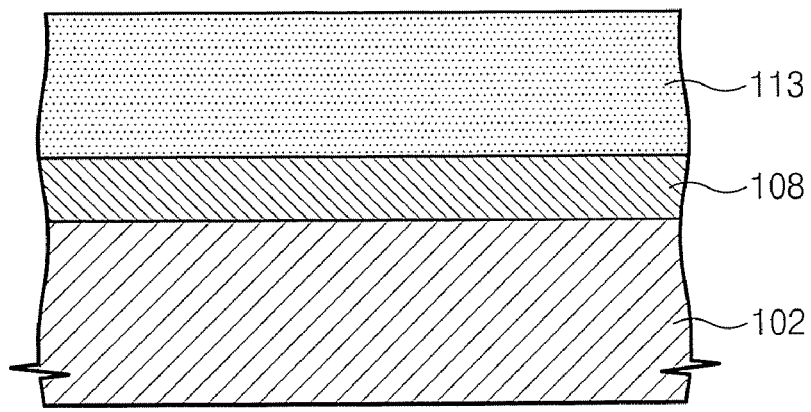
FIG. 6a and FIG. 6b illustrate an enlarged view of portion A of FIG. 2 for illustrating a method for forming a diffusion barrier film in the method of forming a semiconductor device according to some embodiments of the present invention.

Referring to FIG. 2, FIG. 5, and FIG. 6a, a metal nitride layer 113 is deposited on a substrate 100 having an opening 106 using a MOCVD process (S150). The metal nitride layer 113 may be formed in a single layer. The metal nitride layer 113 may have a step coverage of high quality by using a MOCVD process. Therefore, the metal nitride layer 113 may be substantially conformally formed on a bottom surface and on a sidewall of the opening 106. The metal nitride layer 113 may be made of a nitride including at least one material selected from a group of niobium, vanadium, tantalum, titanium, zirconium, hafnium, molybdenum, rhenium, tungsten, titanium-silicon, tantalum-silicon and titanium-zirconium.

Figure 6B:
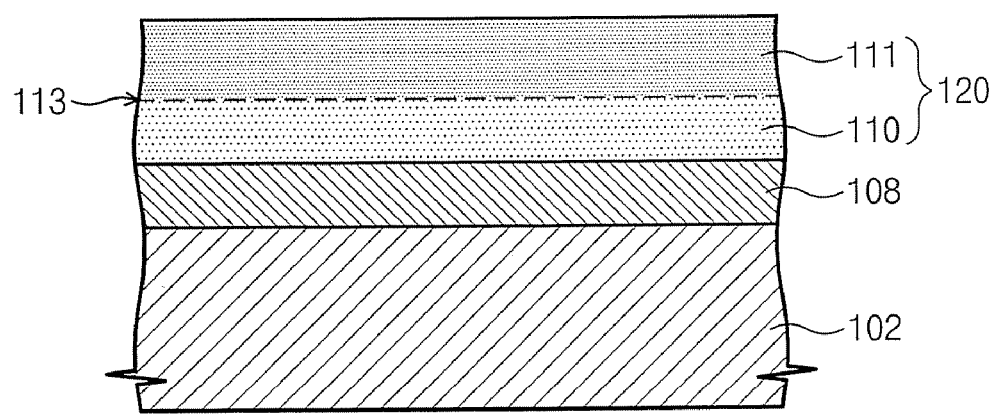

Referring to FIG. 2, FIG. 5, and FIG. 6b, a plasma treatment process is performed on a metal nitride layer 113 (S155). An upper portion of the metal nitride layer 113 is treated by the plasma treatment, and a lower portion of the metal nitride layer 113 is not treated by the plasma treatment. As a result, the diffusion barrier film 120 is formed. The diffusion barrier film 120 includes the plasma-untreated layer 110 corresponding to the lower portion of the metal nitride layer 113, and the plasma-treated layer 111 corresponding to the upper portion of the metal nitride layer 113.

A processing gas used for the plasma treatment process may include at least one material selected from oxygen, nitrogen and hydrogen. A plasma power and/or processing time of the plasma treatment process may be adjusted to treat the upper portion of the metal nitride layer 113 disposed on at least a bottom surface of the opening 106 with the plasma. Accordingly, the plasma-untreated layer 110 and plasma-treated layer 111 are stacked on at least the bottom surface of the opening 106. The metal nitride layer 113 includes a first portion disposed on the bottom surface of the opening 106, a second portion disposed on the sidewall of the opening 106, and a third portion disposed on a top surface of the interlayer dielectric 104. The plasma-treated layer 111 formed in the first and the third portions of the metal nitride layer 113 may be larger in thickness than the plasma-treated layer 111 formed in the second portion of the metal nitride layer 113.

Because the metal nitride layer 113 is formed using the MOCVD process, the metal nitride layer 113 may include carbon. The plasma treatment process can minimize or reduce the quantity of carbon included in the metal nitride layer 113. Thus, the quantity of carbon included in the plasma-treated layer 111 may be significantly smaller than the quantity of carbon included in the plasma-untreated layer 110.

After performing the plasma treatment process, a silicon soaking process may be performed on the metal nitride layer 113 (S160). The silicon soaking process is a process for treating the metal nitride layer using responsive gases including silicon. Silicon may be supplied to the plasma-treated upper portion of the metal nitride layer 113, through the silicon soaking process. The responsive gases for the silicon soaking process may include, for example, $SiH_4$ gas.

According to the above method described with reference to FIG. 5, FIG. 6a and FIG. 6b, after depositing a single layer of the metal nitride layer 113 on the substrate 100, the plasma treatment process (S155) may be performed to form the diffusion barrier film 120.

Alternatively, a plurality of sub-metal nitride layers may be deposited on the substrate to form the diffusion barrier film. This will be described with reference to FIG. 7, FIG. 8a, FIG. 8b and FIG. 8c.

Figure 7:
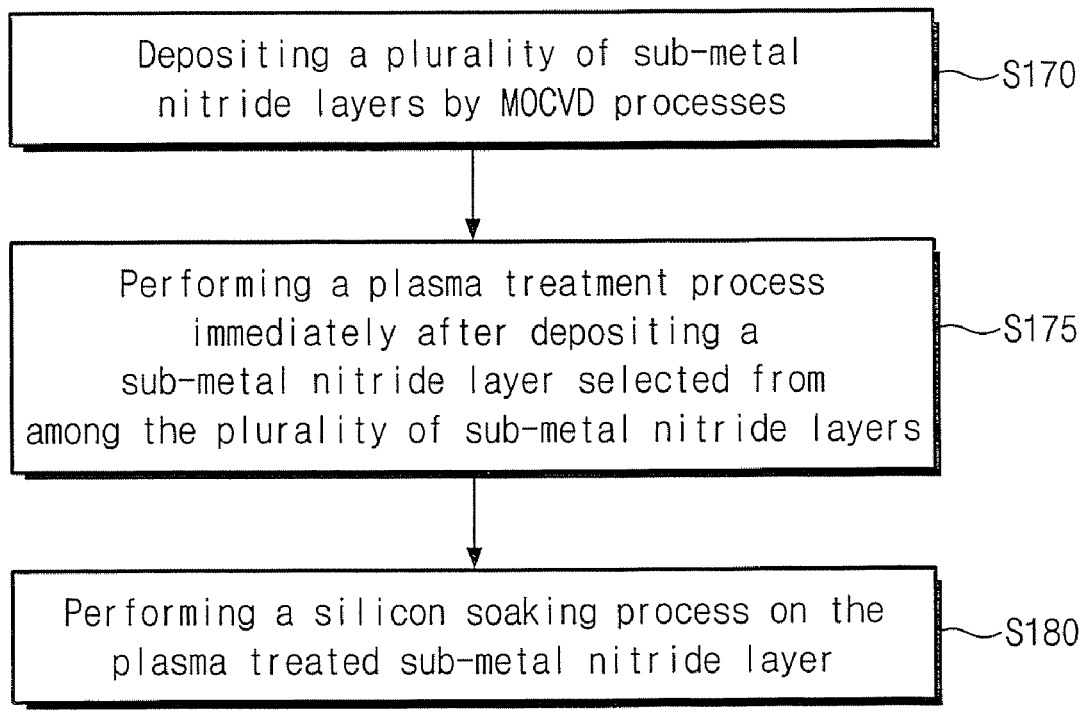
FIG. 7 is a flow chart illustrating another method of forming a diffusion barrier film in the method of forming a semiconductor device according to some embodiments of the present invention.
Figure 8A:
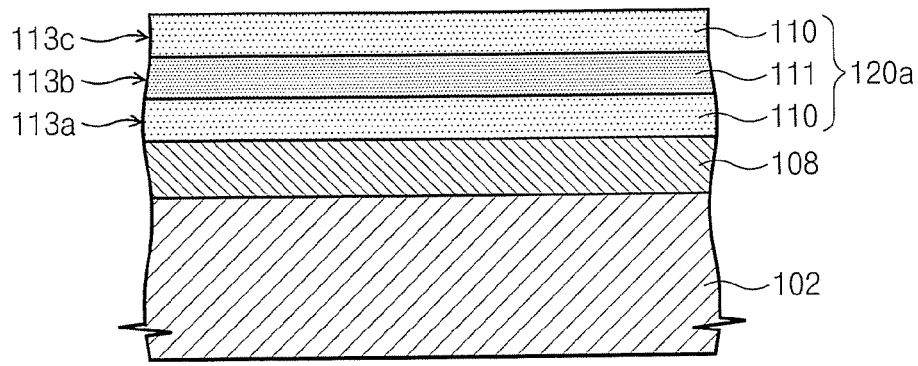
FIG. 8a is an enlarged cross-sectional view of portion A of FIG. 2 for illustrating another method of forming a diffusion barrier film in a method of forming a semiconductor device according to some embodiments of the present invention.
Figure 8B:
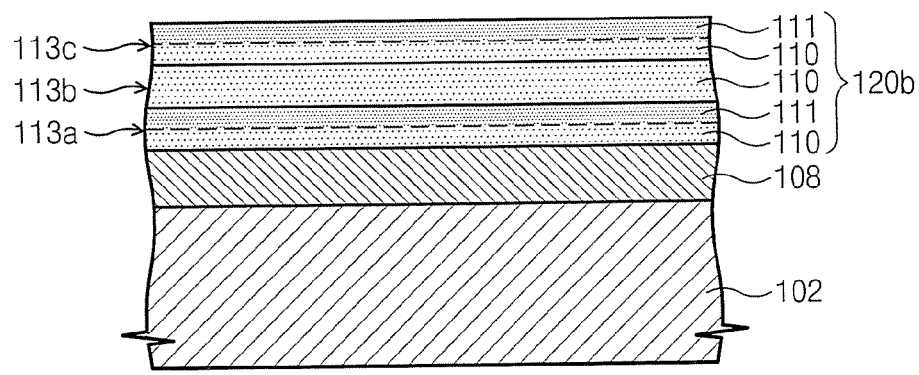
FIG. 8b is an enlarged cross-sectional view of portion A of FIG. 2 for illustrating a modified example of another method of forming a diffusion barrier film in the method of forming a semiconductor device according to some embodiments of the present invention.
Figure 8C:
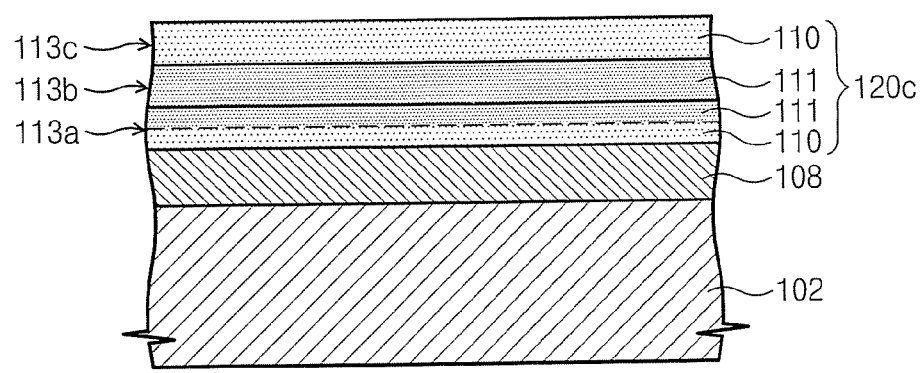
FIG. 8c is an enlarged cross-sectional view of portion A of FIG. 2 for illustrating another modified example of another method of forming a diffusion barrier film in a method of forming a semiconductor device according to some embodiments of the present invention.

FIG. 7 is a flow chart used to illustrate another method of forming a diffusion barrier film in a method of forming a semiconductor device according to some embodiments of the present invention. FIG. 8a is an enlarged cross-sectional view of a portion A of FIG. 2 used to illustrate another method of forming the diffusion barrier film in the method of forming a semiconductor device according to some embodiments of the present invention. FIG. 8b is an enlarged cross-sectional view of the portion A of FIG. 2 used to illustrate still another method of forming a diffusion barrier film in the method of forming a semiconductor device according to some embodiments of the present invention. FIG. 8c is an enlarged cross-sectional view of the portion A of FIG. 2 that illustrates yet another example method of forming a diffusion barrier film in the method of forming a semiconductor device according to some embodiments of the present invention.

Referring to FIG. 2, FIG. 7, and FIG. 8a, a plurality of sub-metal nitride layers 113a, 113b, and 113c are deposited on a substrate 100 (S170). Each of the sub-metal nitride layers 113a, 113b and 113c is formed using a MOCVD process. FIG. 8a illustrates a first, second, and third metal nitride layers 113a, 113b and 113c stacked sequentially. Alternatively, two, four or more layers of sub-metal nitride layers may be deposited on the substrate. Each of the sub-metal nitride layers 113a, 113b and 113c is made of a nitride including a refractory metal. For example, each of the sub-metal nitride layers 113a, 113b and 113c may be made of a nitride including at least one material selected from a group of niobium, vanadium, tantalum, titanium, zirconium, hafnium, molybdenum, rhenium, tungsten, titanium-silicon, tantalum-silicon and titanium-zirconium. The plurality of sub-metal nitride layers 113a, 113b and 113c may be made of the same material. In other embodiments, the plurality of sub-metal nitride layers 113a, 113b and 113c may be made of different materials.

Immediately after the metal nitride layer selected from the plurality of sub-metal nitride layers 113a, 113b and 113c is deposited on the substrate 100, a plasma treatment process is performed on the selected sub-metal nitride layer (S175). In FIG. 8a, the second sub-metal nitride layer 113b corresponds to the selected sub-metal nitride layer. Other sub-metal nitride layers 113a and/or 113b may also be selected. The selected sub-metal nitride layer may be one or more.

Depositing the sub-metal nitride layers 113a, 113b and 113c (S170) and performing a plasma treatment process (S175) will be described herein in further detail, for an example in which the selected sub-metal nitride layer is the second sub-metal nitride layer 113b.

Initially, the first sub-metal nitride layer 113a is deposited conformally on the substrate 100 having the opening 106 using a MOCVD process (S170). Then, the second sub-metal nitride layer 113b is deposited on the first sub-metal nitride layer 113a using a MOCVD process (S170). Immediately after the selected second sub-metal nitride layer 133b is deposited, a plasma treatment process is performed on the selected second sub-metal nitride layer 113b (S175). A processing gas of the plasma treatment process may include nitrogen, oxygen, and/or hydrogen. The quantity of carbon included in the second sub-metal nitride layer 113b may be minimized or reduced by the plasma treatment process.

The selected second sub-metal nitride layer 113b includes a first portion disposed on a bottom surface of the opening 106, a second portion disposed on a sidewall of the opening 106, and a third portion disposed on the top surface of the interlayer dielectric 104. At least the entire first portion of the selected second sub-metal nitride layer 113b may be treated by the plasma treatment. In this case, the entire third portion of the second sub-metal nitride layer may be treated by the plasma treatment, and the second potion of the second sub-metal nitride layer 113b may be only partially treated by the plasma treatment. The plasma-treated portion of the selected second sub-metal nitride layer 113b corresponds to the plasma-treated layer 111.

A third sub-metal nitride layer 113c is deposited on the plasma-treated second sub-metal nitride layer 113b using a MOCVD process (S170). Immediately after each of the first and third sub-metal nitride layers 113a and 113b are deposited, the plasma treatment process is not performed. Accordingly, the first and third sub-metal nitride layers 113a and 113b include the plasma-untreated layer 110. A diffusion barrier film 120a comprises the plasma-untreated layer 110 of the first sub-metal nitride layer 113a, the plasma-treated layer 111 of the second sub-metal nitride layer 113b, and the plasma-untreated layer 110 of the third sub-metal nitride layer 113c.

If at least the entire first portion of the selected sub-metal nitride layer 113b is treated by the plasma treatment as described above, then at least one of the plurality of sub-metal nitride layers 113a, 113b and 113c included in the diffusion barrier film 120a is an unselected sub-metal nitride layer. The plasma treatment process is not performed immediately after the unselected sub-metal nitride layer is deposited. Accordingly, the diffusion barrier film 120a can include the plasma-untreated layer 110.

An upper portion of the first metal nitride layer 113a disposed under the selected sub-metal nitride layer 113b may be treated by the plasma treatment, by the plasma-treatment process performed on the selected sub-metal nitride layer 113b. However, in this case, at least a lower portion of the first sub-metal nitride layer 113a is not treated by the plasma treatment.

A silicon soaking process may be performed on the sub-metal nitride layer 113b treated by the plasma treatment (S180). The silicon soaking process may be identical to the silicon soaking process described with reference to FIG. 5. Silicon may be provided to the plasma-treated sub-metal nitride layer 113b by the silicon soaking process. The silicon soaking process may be performed before depositing the third sub-metal nitride layer 113b on the sub-metal nitride layer 113b treated by the plasma treatment.

In FIG. 8a, at least the entire first portion of the selected sub-metal nitride layer 113b is treated by the plasma treatment. Alternatively, only an upper portion of the sub-metal nitride layer selected from the plurality of sub-metal nitride layers 113a, 113b and 113c may be treated by the plasma treatment. This will be described with reference to FIG. 8b.

Referring to FIG. 2, FIG. 7, and FIG. 8b, a plurality of sub-metal nitride layers 113a, 113b, and 113c are deposited on a substrate 100 (S170). Immediately after the sub-metal nitride layer selected from the plurality of sub-metal nitride layers 113a, 113b and 113c is deposited, a plasma treatment process is performed (S175). In FIG. 8b, the first and third sub-metal nitride layers 113a and 113b may correspond to the selected sub-metal nitride layer. Alternatively, other sub-metal nitride layers may be selected. In the case that the first and third sub-metal nitride layers 113a and 113c are selected, the steps S170 and S175 will be described in further detail.

The selected first sub-metal nitride layer 113a is deposited on the substrate 100 having the opening 106 using a MOCVD process (S170). Then, a plasma treatment process is performed on the selected first sub-metal nitride layer 113a (S175). The upper portion of the selected first sub-metal nitride layer 113a is treated by the plasma treatment. In other words, the lower portion of the selected first sub-metal nitride layer 113a is not treated by the plasma treatment. Accordingly, the upper portion of the selected first sub-metal nitride layer 113a corresponds to the plasma-treated layer 111, and the lower portion of the selected first sub-metal nitride layer 113a corresponds to the plasma-untreated layer 110.

An unselected second sub-metal nitride layer 113b is deposited on the plasma-treated first sub-metal nitride layer 113a using a MOCVD process (S170). The selected third sub-metal nitride layer 113c is deposited on the second sub-metal nitride layer 113b using the MOCVD process (S170). Because the second sub-metal nitride layer 113b is not treated by the plasma treatment, the second sub-metal nitride layer 113b corresponds to the plasma-untreated layer 110. The plasma treatment process described with reference to FIG. 8b may have a lower plasma power than the plasma treatment process described with reference to FIG. 8a. The plasma treatment process described with reference to FIG. 8b may take a shorter processing time than the plasma treatment process described with reference to FIG. 8a.

Immediately after the selected third sub-metal nitride layer 113c is deposited, a plasma treatment process is performed on the selected third sub-metal nitride layer 113c (S180). An upper portion of the selected third sub-metal nitride layer 113c is treated by the plasma treatment. Accordingly, the upper portion of the selected third sub-metal nitride layer 113c corresponds to the plasma-treated layer 111, and a lower portion of the selected third sub-metal nitride layer 113c corresponds to the plasma-untreated layer 110.

A diffusion barrier film 120b includes the plasma-untreated layer 110 and the plasma-treated layer 111 in the first sub-metal nitride layer 113a, the plasma-untreated layer 110 of the second sub-metal nitride layer 113b, and the plasma-untreated layer 110 and the plasma-treated layer 111 in the third sub-metal nitride layer 113c.

A silicon soaking process may be done on at least one of the plasma-treated sub-metal nitride layers 113a and 113c (S180). Thus, the plasma-treated layer 111 may include silicon. The silicon soaking process may be performed before subsequently depositing the sub-metal nitride layer.

In case upper portions of the selected sub-metal nitride layers 113a and 113c are treated with plasma, the selected sub-metal nitride layers include both the plasma-untreated layer 110 and the plasma-treated layer 111. Therefore, all of the plurality of sub-metal nitride layers 113a, 113b and 113c may be the selected sub-metal nitride layer.

The diffusion barrier film on the bottom surface of the opening 106 may include the sub-metal nitride layer partially treated by the plasma treatment as well as the sub-metal nitride layer entirely treated by the plasma treatment. This will be described herein with reference to FIG. 8c.

Referring to FIG. 2, FIG. 7 and FIG. 8c, a plurality of sub-metal nitride layers 113a, 113b and 113c is deposited on a substrate 100 having an opening 106 (S170). After a sub-metal nitride layer selected from the plurality of sub-metal nitride layer 113a, 113b and 113c is deposited, a plasma treatment process is performed (S175). The plurality of sub-metal nitride layers 113a, 113b and 113c includes at least one first-selected sub-metal nitride layer and at least one second-selected sub-metal nitride layer. In FIG. 8c, the first sub-metal nitride layer 113a corresponds to the first-selected sub-metal nitride layer, and the second sub-metal nitride layer 113b corresponds to the second-selected sub-metal nitride layer. The plasma treatment process includes a first plasma treatment process and a second plasma treatment process. The first plasma treatment process is performed on the first-selected sub-metal nitride layer, and the second plasma treatment process is performed on the second-selected sub-metal nitride layer. The steps S170 and S175 will be described herein in further detail.

The first sub-metal nitride layer 113a corresponding to the first-selected sub-metal nitride layer is deposited on the substrate 100 having the opening 106 (S170). The first plasma treatment process is performed on the first sub-metal nitride layer 113a (S175). An upper portion of the first sub-metal nitride layer 113a is treated by the plasma treatment by the first plasma treatment process. Thus the first sub-metal nitride layer 113a includes sequentially stacked a plasma-untreated layer 110 and a plasma-treated layer 111. A processing gas of the first plasma treatment process may include nitrogen, hydrogen, and/or oxygen.

Then, the second sub-metal nitride layer 113b corresponding to the second-selected sub-metal nitride layer is deposited on the first sub-metal nitride layer 113a using a MOCVD process (S170). The second plasma treatment process is performed on the second sub-metal nitride layer 113a (S175). An entirety of the second sub-metal nitride layer 113b on the bottom surface of the opening 106 is treated by the plasma treatment of the second plasma treatment process. Accordingly, the second sub-metal nitride layer 113b on the bottom surface of the opening 106 corresponds to a plasma-treated layer 111. A processing gas of the second plasma treatment process may include nitrogen, hydrogen, and/or oxygen. A plasma power of the second plasma treatment process may be higher than the plasma power of the first plasma treatment process. Also, the second plasma treatment process may take more processing time than the first plasma treatment process.

A third sub-metal nitride layer 113c may be deposited on the second sub-metal nitride layer 113b using a MOCVD process (S170). A plasma treatment process may not be done after the third sub-metal nitride layer 113c is deposited. Accordingly, an entire third sub-metal nitride layer 113c corresponds to a plasma-untreated layer 110. A diffusion barrier film 120c comprises the plasma-untreated layer 110 and the plasma-treated layer 111 in the first sub-metal nitride layer 113a, the plasma-treated layer 111 of the second sub-metal nitride layer 113b, and the plasma-untreated layer 110 of the third sub-metal nitride layer 113c.

The above-described method includes a first-selected sub-metal nitride layer, which includes the sequentially stacked plasma-untreated layer 110 and plasma-treated layer 111. Therefore, the third sub-metal nitride layer 113c may be first-selected or second-selected.

A silicon soaking process may be performed on at least one of the plasma-treated sub-metal nitride layers 113a and 113b (S180). As a result, the plasma-treated layers 111 may include silicon. In case another sub-metal nitride layer is to be deposited on the plasma-treated sub-metal nitride layer on which the silicon soaking process is performed, the sub-metal nitride layer may be deposited after the silicon soaking process has been done.

The diffusion barrier film 120 in FIG. 2 may be substituted for with the diffusion barrier films 120a, 120b, or 120c disclosed in FIG. 8a, FIG. 8b or 8c.

Figure 3:
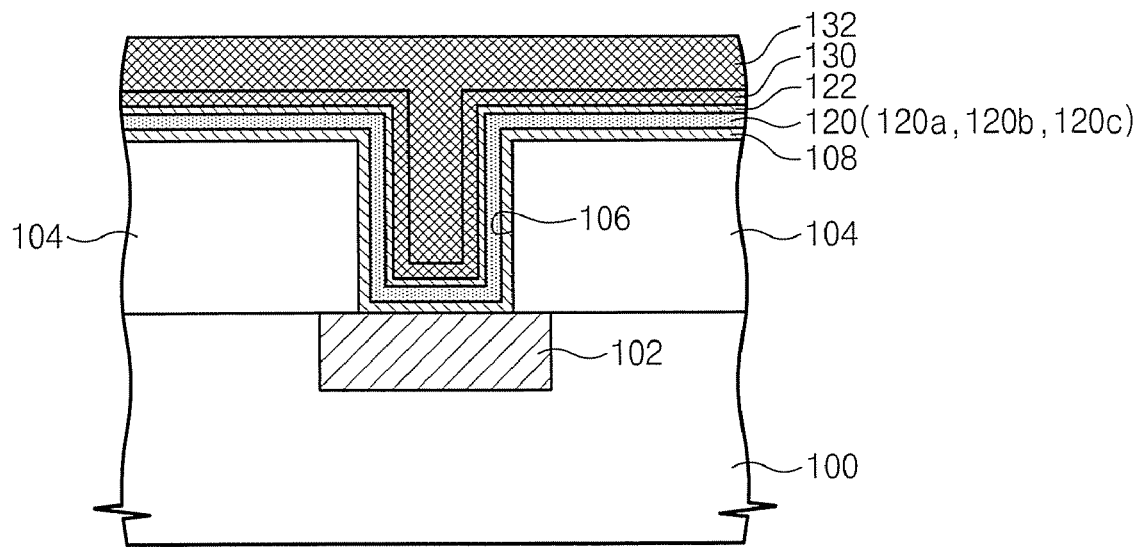

Referring to FIG. 3, an adhesive metal layer 122 may be formed on the diffusion barrier film 120. The adhesive metal layer 122 may include titanium or tantalum. An upper conductor 130 and 132 is formed on the adhesive metal layer 122 to fill the opening 106.

The upper conductor 130 and 132 may include aluminum. The upper conductor 130 and 132 may include a first aluminum layer 130 and a second aluminum layer 132, sequentially stacked. The first aluminum layer 130 may be formed by a CVD process having excellent step coverage. The second aluminum layer 132 may be formed by a PVD process having rapid growth to improve throughput. A reflow process may be performed on the substrate 100. Heat may be provided to at least the second aluminum layer 132 through the reflow process, such that the second aluminum layer 132 sufficiently fills the opening 106. The reflow process may be done after the second aluminum layer 132 is formed. Alternatively, the reflow process may be performed in-situ with the process forming the second aluminum layer 132. In other words, the second aluminum layer 132 may be formed in a physical vapor deposition chamber (PVD chamber) in which a processing temperature of the reflow process is given. The first and second aluminum layers 130 and 132 may be made of aluminum alloy.

After the diffusion barrier film 120 is formed, the adhesive metal layer 122 may be omitted when the first aluminum layer 130 is formed without the diffusion barrier film 120 being exposed to the air. Alternatively, if the first aluminum layer 130 is formed after the diffusion barrier film 120 is exposed to the air, the adhesive metal layer 122 may be formed. In this case, the adhesive metal layer 122 may function so as to increase the growth rate of the first aluminum layer 130.

Figure 4:
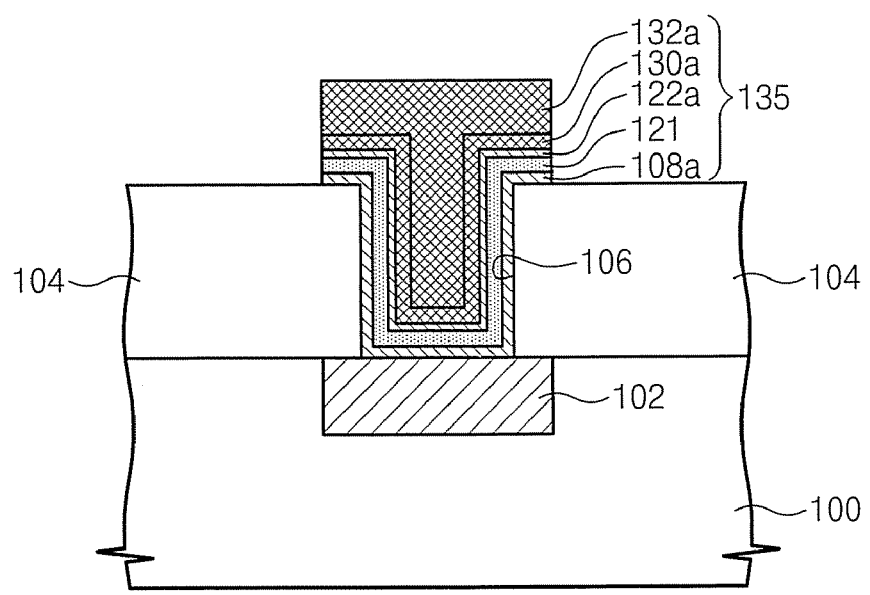

Referring to FIG. 4, the second aluminum layer 132, first aluminum layer 130, adhesive metal layer 122, diffusion barrier film 120, and a supplementary diffusion barrier layer 108 may be successively patterned to form a conductive pattern 135. The conductive pattern 135 fills the opening 106. The conductive pattern 135 may be made in various forms, such as a pad-form or a line-form. The conductive pattern 135 includes a supplementary diffusion barrier pattern 108a, a diffusion barrier pattern 121, an adhesive pattern 122a, a first aluminum pattern 130a, and a second aluminum pattern 132a, sequentially stacked.

Alternatively, the second aluminum layer 132, first aluminum layer 130, adhesive metal layer 122, diffusion barrier film 120, and supplementary diffusion barrier layer 108 may be planarized until an interlayer dielectric 104 is exposed. In this case, a conductive plug that fills the opening 106 is formed, and an interconnection or a pad that may be formed on the interlayer dielectric 104 to be connected to the conductive plug.

Other methods for the upper conductor 130 and 132 to fill the opening 106 sufficiently, in accordance with some embodiments of the present invention, will be described below with reference to FIG. 9 and FIG. 10.

Figure 9:
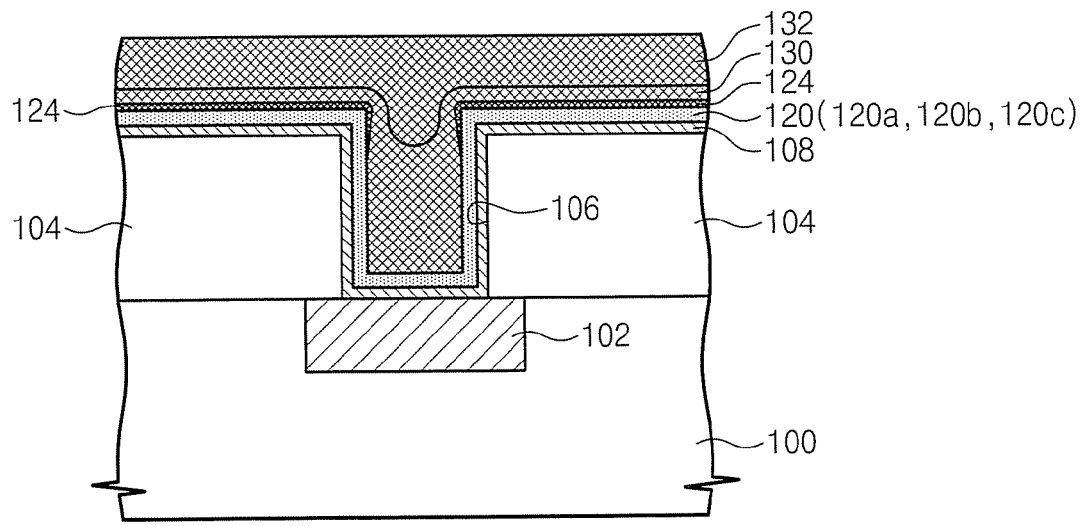
FIG. 9 is a cross-sectional view for illustrating yet another method of forming an upper conductor in a method of forming a semiconductor device according to some embodiments of the present invention.

FIG. 9 is a cross-sectional view that illustrates another method of forming an upper conductor in the method of forming a semiconductor device according to some embodiments of the present invention. FIG. 10 is another cross-sectional view to illustrate yet another method of forming an upper conductor in the method of forming a semiconductor device according to some embodiments of the present invention.

Referring to FIG. 3 and FIG. 9, a growth restraining layer 124 is formed on a diffusion barrier film 120. The growth restraining layer 124 may be made of a metal nitride, which has a higher nitrogen concentration than the diffusion barrier film 120. The diffusion barrier film 120 includes a first portion formed on a bottom surface of the opening 106, a second portion formed on a sidewall of the opening 106, and a third portion formed on a top surface of the interlayer dielectric 104. The growth restraining layer 124 may be formed on the third portion of the diffusion barrier film 120. The growth restraining layer 124 may be formed to cover top corners where the second portion and the third portion of the diffusion barrier film 120 are connected. Here, at least a portion of the second portion of the diffusion barrier film 120 is exposed. The growth restraining layer 124 may be formed by a PVD process. The growth restraining layer 124 may be formed on a part of the first portion of the diffusion barrier film 120.

The growth restraining layer 124 has a higher nitrogen concentration than the diffusion barrier film 120. Because of this difference in nitrogen concentration, the growth rate of the first aluminum layer 130 is varied, the first aluminum layer 130 being formed using a CVD process. In other words, the growth rate of the first aluminum layer 130 formed on the growth restraining layer 124 is lower than the growth rate of the first aluminum layer 130 formed on the diffusion barrier film 120. The growth restraining layer 124 covers the top corners of the opening 106, and a portion of the diffusion barrier film 120 in the opening 106 is exposed. Accordingly, the first aluminum layer 130 grows relatively rapidly in the opening 106, and the first aluminum layer 130 grows relatively slowly in the top corners and outside of the opening 106. As a result, the first aluminum layer 130 may sufficiently fill at least a lower portion of the opening 106, while preventing or reducing a void and/or a seam. The aspect ratio of the opening 106 may be decreased significantly by the first aluminum layer 130, or the first aluminum layer 130 may fill the opening 106. Then a second aluminum layer 132 is formed on the first aluminum layer 130. Processes following the forming of the second aluminum layer 132 may be performed in the same way as the method described above with reference to FIG. 4.

The growth restraining layer 124 and the first aluminum layer 130 may be sequentially formed without the diffusion barrier film 120 exposed to the air. In this case, the diffusion barrier film 120, growth restraining layer 124, and first aluminum layer 130 may be formed in one apparatus including a transfer chamber and a plurality of processing chambers mounted in the transfer chamber.

An adhesive metal layer 122 of FIG. 3 may be formed on the diffusion barrier film 120, before forming the growth restraining layer 124. In this case, after the growth restraining layer 124 is formed, the adhesive metal layer 122 formed on at least a sidewall of the opening 106 is exposed. At this time, varied growth rate of the first aluminum layer 130 by a CVD may be achieved because the growth restraining layer 124 includes significantly more nitrogen concentration than the adhesive metal layer 122.

Another method of forming the upper conductors 130 and 132 to fill the opening 106 sufficiently, in accordance with some embodiments of the present invention, will be described herein with reference to FIG. 10.

Figure 10:
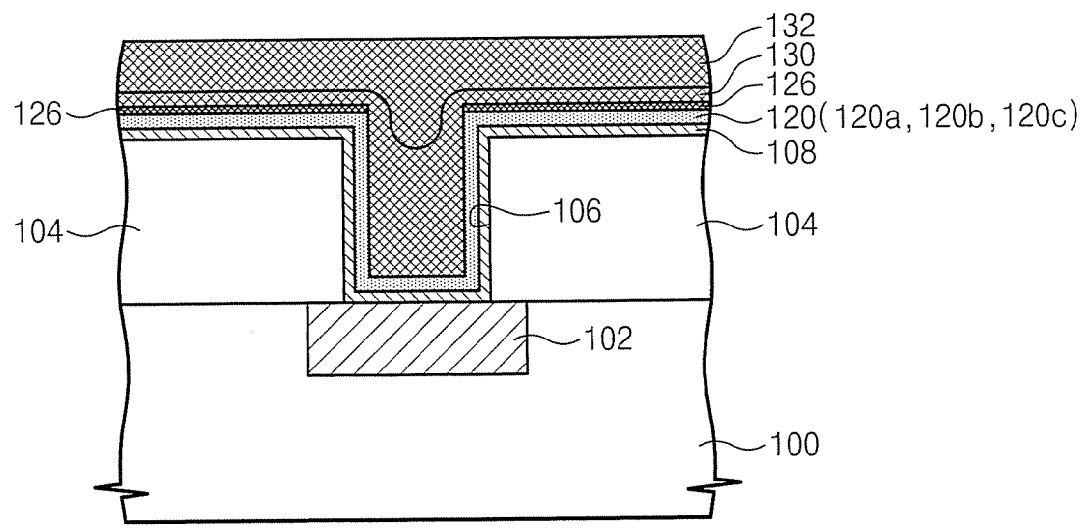
FIG. 10 is a cross-sectional view for illustrating another method of forming an upper conductor in a method of forming a semiconductor device according to some embodiments of the present invention.

Referring to FIG. 3 and FIG. 10, a growth restraining plasma treatment process may be performed on a substrate 100 having a diffusion barrier film 120. A processing gas including nitrogen is used in the growth restraining plasma treatment process. Through the growth restraining plasma treatment process, nitrogen is supplied to the diffusion barrier film 120 to form a nitrogen supply layer 126. The nitrogen supply layer 126 may be formed in a surface of the diffusion barrier film 120, which is disposed on a top surface of the interlayer dielectric 104. The amount of nitrogen supplied to the diffusion barrier film 120 in the opening 106 is significantly less than the amount of nitrogen supplied to the nitrogen supply layer 126. The nitrogen concentration of the diffusion barrier film 120 in the opening 106 is lower than the nitrogen concentration of the diffusion barrier film 120 on the outside of the opening 106. The growth restraining plasma treatment process may have a lower plasma power and/or be given a shorter processing time than the plasma treatment process described with reference to FIG. 5 and FIG. 7. Accordingly, the growth restraining plasma treatment process is mostly done on a top surface of the interlayer dielectric 104, and the growth restraining plasma treatment process is generally not done in the opening 106.

Next, a first aluminum layer 130 is formed on the substrate 100 using a CVD process. Due to a difference in nitrogen concentration by the growth restraining plasma treatment process, a growth rate of the first aluminum layer 130 in the opening 106 is higher than a growth rate of the first aluminum layer 130 on the outside of the opening 106. As a result, the first aluminum layer 130 may sufficiently fill at least a lower portion of the opening 106, while preventing a void and/or a seam. A second aluminum layer 132 may be formed on the first aluminum layer 130 using a PVD process. Processes following the forming of the second aluminum layer 132 may be performed in the same way as the method described above with reference to FIG. 4. The growth restraining plasma treatment process may be performed in the chemical vapor deposition chamber in which the first aluminum layer 130 is formed. In other words, the growth restraining plasma treatment and the deposition of the first aluminum layer 130 may be performed in the CVD chamber sequentially.

The adhesive metal layer 122 of FIG. 3 may be formed on the diffusion barrier film 120 before performing the growth restraining plasma treatment process. In this case, through the growth restraining plasma treatment process, the nitrogen supply layer 126 may be formed in the adhesive metal layer 122, the adhesive metal layer 122 being disposed on a top surface of the interlayer dielectric 104. A varied growth rate of the first aluminum layer 130 may be achieved as the nitrogen supply layer 126 has significantly more nitrogen concentration than the adhesive metal layer 122 exposed in the opening 106.

According to the above-described methods of forming a semiconductor device, portions of the diffusion barrier films 120, 120a, 120b, and 120c are treated by the plasma treatment, and the other portions of the diffusion barrier films 120, 120a, 120b and 120c are not treated by the plasma treatment. Therefore, the diffusion barrier films 120, 120a, 120b, or 120c interposed between the lower conductor 102 and upper conductor 130 and 132 include plasma-untreated layers 110 and plasma-treated layers 111. A quantity of carbon included in the plasma treated layer 111 is minimized or reduced by the plasma treatment, and the plasma-treated layer 111 may be in a crystallized state. As a result, a specific resistance of the plasma-treated layer 111 is decreased. The plasma-untreated layer 110 includes a larger quantity of carbon than the plasma-treated layer 111. Also, the plasma-untreated layer 110 may be in an amorphous state. The plasma-untreated layer 110 may have a superior barrier characteristic than the plasma-treated layer 111. The diffusion barrier films 120, 120a, 120b, or 120c can have a lower specific resistance by the plasma-treated layer 111 and can acquire a superior barrier characteristic by the plasma-untreated layer 110. Metal atoms in the lower conductor 102 and metal atoms in the upper conductors 130 and 132 are not bonded to each other by the diffusion barrier films 120, 120a, 120b, and 120c. Accordingly, a semiconductor device having an excellent electrical characteristic may be realized.

If an entire metal nitride layer formed by a MOCVD process is treated by a plasma treatment, a specific resistance of the metal nitride layer is decreased while the barrier characteristic of the metal nitride layer is also decreased. In other words, the entire metal nitride layer is converted to a crystalline state by the plasma treatment. In this case, the metal atoms in an upper conductor and a lower conductor are diffused along the boundary of the crystalline metal nitride layer to be bonded to each other. This may cause an alloy of high specific resistance to be generated to deteriorate the electrical characteristic of the semiconductor device. However, the diffusion barrier films 120, 120a, 120b, or 120c include both the plasma-treated layer 111 and plasma-untreated layer 110. Accordingly, the diffusion barrier films 120, 120a, 120b, or 120c have a low specific resistance as well as a distinguished barrier characteristic.

Silicon is provided to the plasma-treated layer 111 by the silicon soaking process. The provided silicon may be bonded to the boundary of the crystalline plasma-treated layer 111. Therefore, the specific resistance of the plasma-treated layer 111 is decreased and the barrier characteristic of the plasma-treated layer 111 is enhanced by the silicon soaking process.

In addition, a supplementary diffusion barrier layer 108 may be formed before the diffusion barrier films 120, 120a, 120b, or 120c are formed. The metal atoms in the lower conductor 102 and the upper conductors 130 and 132 may further be blocked from diffusion by the supplementary diffusion barrier layer 108. When the lower conductor 102 includes copper having a high diffusion coefficient, the supplementary diffusion barrier layer 108 may serve so as to minimize the copper atoms in the lower conductor 102 from being diffused to the upper conductor 130 and 132.

An experiment was performed to identify the barrier characteristic of the diffusion barrier films 120, 120a, 120b, or 120c. A sample 1 and a sample 2 were prepared for the experiment. A copper layer, a tantalum layer, a first diffusion barrier film, and an aluminum layer were sequentially formed on a substrate for the sample 1. The first diffusion barrier film was made in three layers of titanium nitride layers using a MOCVD process. Immediately after each of the titanium nitride layers included in the first diffusion barrier film was deposited on the substrate, a plasma treatment process was performed with a sufficient plasma power. In other words, the first diffusion barrier film was formed by the three titanium nitride layers completely treated by the plasma treatment.

For the sample 2, a copper layer, a tantalum layer, a second diffusion barrier film and an aluminum layer were sequentially formed on a substrate. The second diffusion barrier film was made in three layers of titanium nitride layers using a MOCVD process. A thickness of each titanium nitride layer of the second diffusion barrier film and the thickness of each titanium nitride layer of the first diffusion barrier film were identical. A first titanium nitride layer included in the second diffusion barrier film was deposited and immediately treated with a first plasma treatment process. A second titanium nitride layer included in the second diffusion barrier film was deposited and immediately treated with a second plasma treatment process. And then, a third titanium nitride layer included in the second diffusion barrier film was deposited, but not treated with a plasma treatment process. A plasma power of the first plasma treatment process was adjusted to be lower than a plasma power of the second plasma treatment process. In other words, the second diffusion barrier film was formed in the same method as the method of forming the diffusion barrier film 120c discussed above with reference to FIG. 8c. All other processes were performed under the same conditions except for the degree of the plasma treatment on the first and the second diffusion barrier films in the samples 1 and 2.

The first and second samples were heated for one hour in a temperature of approximately 400° C. Sheet resistances of the sample 1 were measured before and after heating the sample 1, and sheet resistances of the sample 2 were also measured before and after heating the sample 2. As a result, the sheet resistance after heating the sample 1 increased for approximately 380% to the sheet resistance measured before heating the sample 1. In contrast, the sheet resistance measured after heating the sample 2 increased by approximately 20% as compared to the sheet resistance measured before heating the sample 2. It can be inferred that the copper atoms in the copper layer and the aluminum atoms in the aluminum layer in the sample 1 were bonded to each other to form a large quantity of aluminum-copper alloy having a high-resistance. It can be inferred that the diffusion of copper atoms and aluminum atoms in the sample 2 was minimized. The sample 2 had the diffusion barrier film according to embodiments of the present invention.

Exemplary Embodiment 2

In this exemplary embodiment, a method of forming a NAND non-volatile memory device including the diffusion barrier film according to some embodiments of the present invention will be described.

FIG. 11 to FIG. 14 are cross-sectional views that illustrate methods of forming a semiconductor device according to another exemplary embodiment of the present invention.

Figure 11:
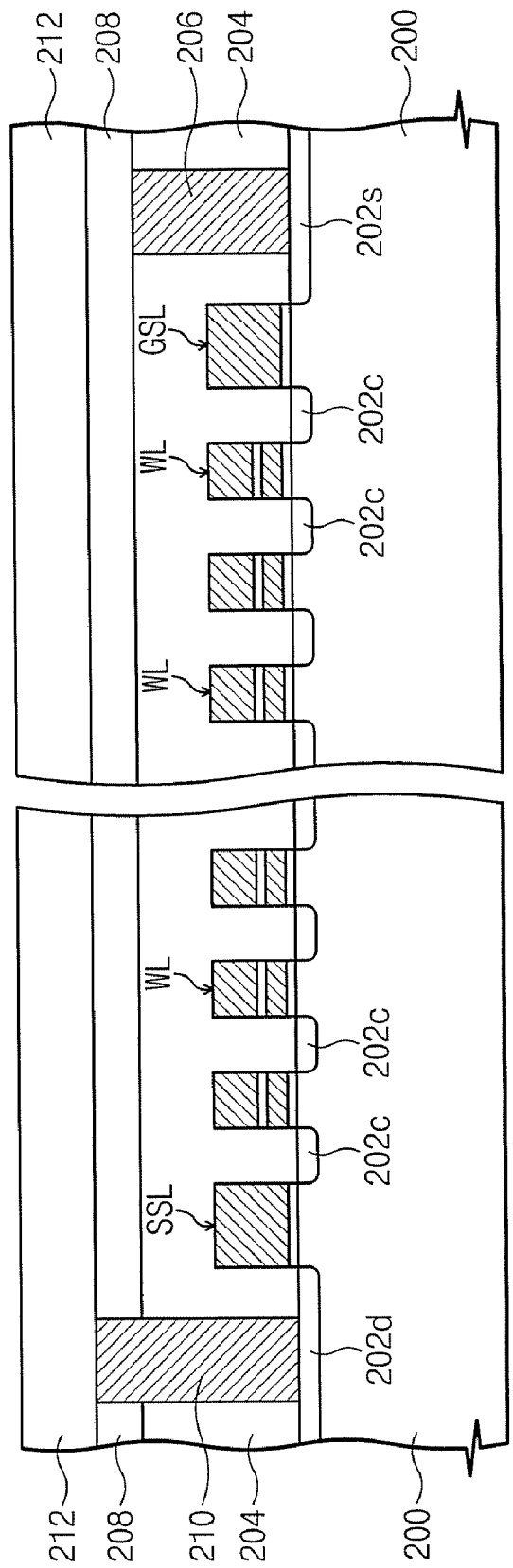
FIG. 11 to FIG. 14 are cross-sectional views for illustrating a method of forming a semiconductor device according to further exemplary embodiments of the present invention.

Referring to FIG. 11, a device isolation layer (not shown) is formed on a semiconductor substrate 200 to define active regions. The active regions are extended in one direction parallel to each other. A string selection line SSL, a ground selection line GSL, and a plurality of word lines WL are formed on the semiconductor substrate 200. The string selection line SSL and the ground selection line GSL cross over the active regions in parallel, and the plurality of word lines WL cross over the active regions interposed between the string selection line SSL and the ground selection line GSL in parallel. The string selection line SSL includes a gate insulation layer and a string selection gate line that are sequentially stacked, and the ground selection line GSL includes a gate insulation layer and a ground selection gate line that are sequentially stacked. Each of the word lines WL includes a tunnel insulation layer, a charge storage pattern, a blocking insulation pattern, and a control gate line that are sequentially stacked. The charge storage pattern may be formed of doped polysilicon or undoped polysilicon. Alternatively, the charge storage pattern may be formed of materials having deep levels of traps (e.g. silicon nitride or nano-crystals). The blocking insulation pattern may be formed of an oxide layer or an ONO (Oxide-Nitride-Oxide) layer. Alternatively, the blocking insulation pattern may include high dielectric material that has a higher dielectric constant than the tunnel insulation layer. For example, the high dielectric material may include at least one insulating metal oxide, such as hafnium oxide or aluminum oxide etc.

Dopant ions are injected using the string selection line SSL, the plurality of word lines WL, and the ground selection line GSL as a mask, to form a common drain region 202d, cell source/drain regions 202c, and a common source region 202s in the respective active regions. The cell source/drain regions 202c are formed in the active regions on both sides of the word lines WL. The common drain region 202d is formed in the active region at one side of the string selection line SSL. The common source region 202s is formed in the active region at one side of the ground selection line GSL. The string selection line SSL, plurality of word lines WL, cell source/drain regions 202c, and ground selection line GSL are interposed between the common drain region 202d and the common source region 202s.

A first interlayer dielectric 204 is formed on an entire surface of the semiconductor substrate 200. The first interlayer dielectric 204 is patterned to form a groove, which exposes the common source region 202s. The groove is parallel to the ground selection line GSL. A first conductive layer is formed on the semiconductor substrate 200 to fill the groove, and the first conductive layer is planarized until the first interlayer dielectric layer 204 is exposed to form a source line 206 in the groove. The source line 206 is connected to the common source region 202s.

A second interlayer insulation layer 208 is formed on an entire surface of the semiconductor substrate 200. The second interlayer dielectric 208 covers the source line 206. A bitline plug 210 is formed in the second and first interlayer dielectric 208 and 204. The bitline plug 210 penetrates the second and the first interlayer dielectrics 208 and 204 to be connected to the common drain region 202d. The bitline plug 210 may include tungsten. A mold insulation layer 212 may be formed on an entire surface of the semiconductor substrate 200 having the bitline plug 210.

Figure 12:
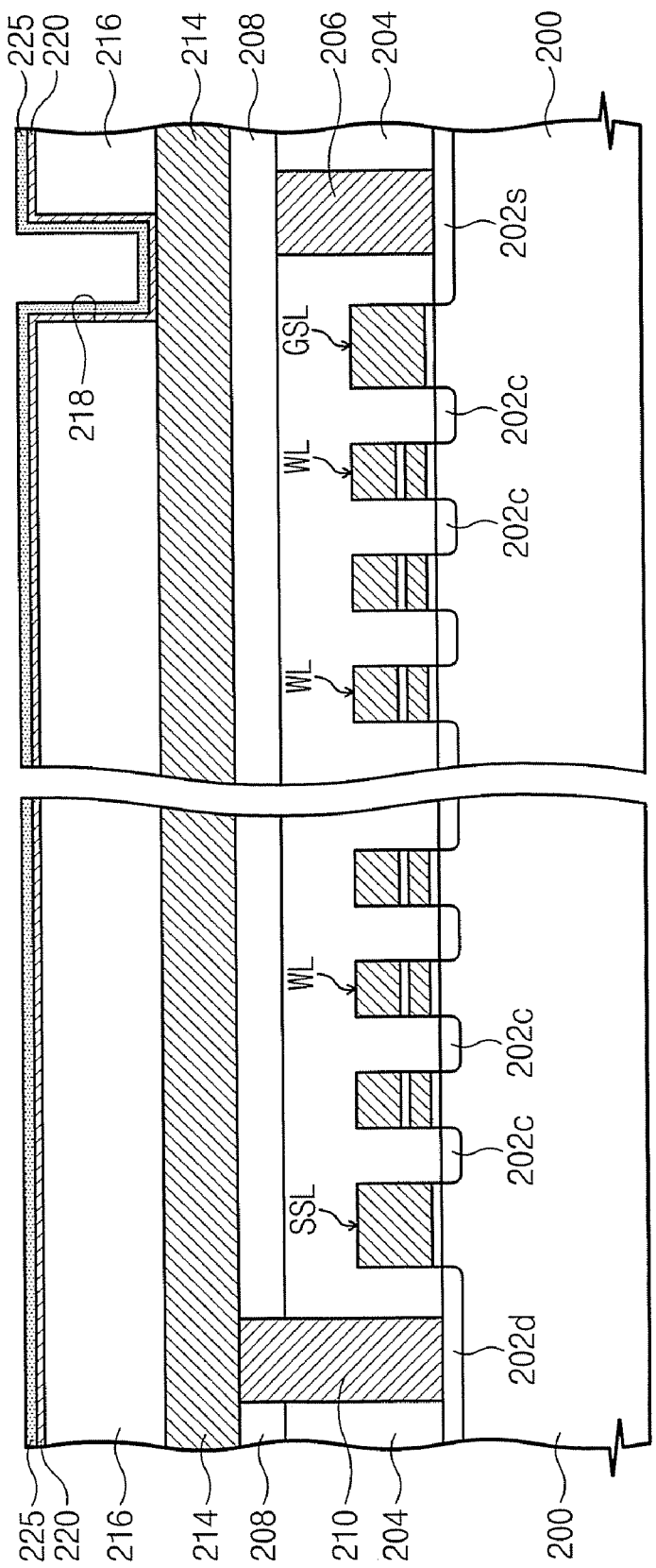

Referring to FIG. 12, the mold insulation layer 212 is patterned to form a bitline groove. The bitline groove exposes the bitline plug 210, and crosses over the lines SSL, WL, and GSL. The bitline groove is formed over the active region, and is parallel to the active region. FIG. 12 is a cross-sectional view taken along a longitudinal direction of the bitline groove. Therefore, the mold insulation 212 is not shown. A bitline 214, which fills the bitline groove is formed. The bitline 213 is connected to the bitline plug 210. The bitline 214 includes at least one material selected from copper and/or a precious metal. The above method of forming the bitline 214 may involve a damascene process using the bitline groove.

Alternatively, the bitline 214 may be formed using a patterning process. In this case, the mold insulation layer 212 is not required. In other words, after the bitline plug 210 is formed, a second conductive layer is formed on the second interlayer dielectric 208, and then the second conductive layer may be patterned to form the bitline 214.

A third interlayer dielectric 216 is formed on an entire surface of the semiconductor substrate 200 having the bitline 214, and then the third interlayer dielectric 216 is patterned to form an opening 218, which exposes the bitline 214. A supplementary diffusion barrier layer 220 may be formed on an entire surface of the semiconductor substrate 200 having the opening 218. The supplementary diffusion barrier layer 220 may be formed using the same material and method as the supplementary diffusion barrier layer 108 of FIG. 1. The supplementary diffusion barrier layer 220 may be omitted.

A diffusion barrier film 225 may be formed on the supplementary diffusion barrier layer 220. The diffusion barrier film 225 may be formed using the same material and method as the diffusion barrier film 120 described above with reference to FIG. 2, FIG. 5, FIG. 6a, and FIG. 6b. Alternatively, the diffusion barrier film 225 may be formed using the same material and method as the diffusion barrier films 120a, 120b or 120c described with reference to FIG. 2, FIG. 7, FIG. 8a, FIG. 8b and FIG. 8c. Therefore, the diffusion barrier film 225 includes a metal nitride formed using MOCVD. The diffusion barrier film 225 also includes a plasma-treated layer and a plasma-untreated layer.

Figure 13:
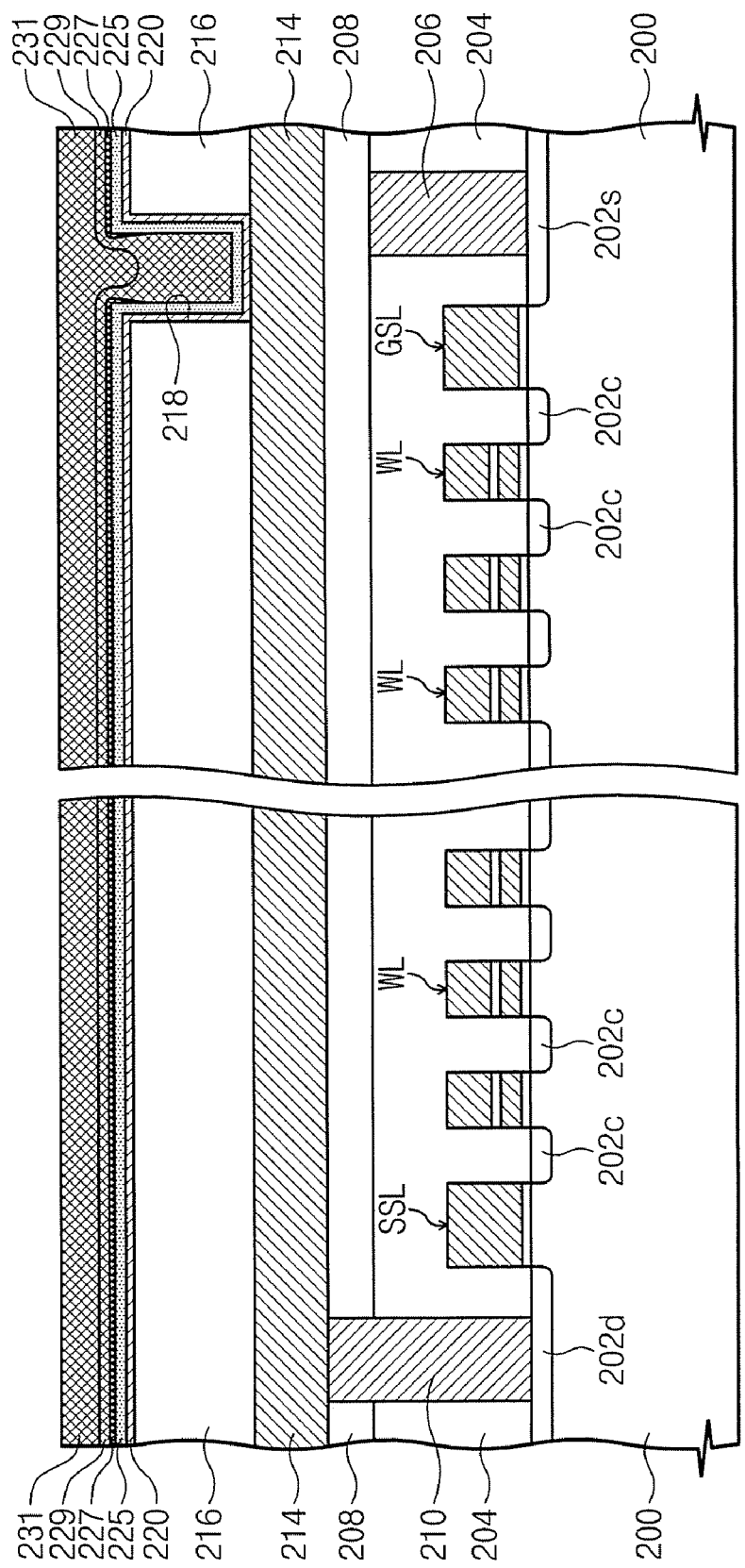

Referring to FIG. 13, a growth restraining layer 227 is formed on a semiconductor substrate 200 having the diffusion barrier film 225 using a PVD process. The growth restraining layer 227 is formed of a conductive material. The growth restraining layer 227 covers the diffusion barrier film 225 disposed on a top surface of the third interlayer dielectric. The growth restraining layer 227 also covers the diffusion barrier film 225 disposed on top corners of the opening 218 to expose the diffusion barrier film 225 being formed on at least a lower sidewall of the opening 218. The growth restraining layer 227 may include the same material as the growth restraining layer 124 of FIG. 9.

A first aluminum layer 229 is formed on an entire surface of the semiconductor substrate 200 using a CVD process. The first aluminum layer 229 includes aluminum. The growth restraining layer 227 allows the first aluminum layer 229 to sufficiently fill at least a lower portion of the opening 218.

Alternatively, the forming of the growth restraining layer 227 may be omitted, and the formerly described growth restraining plasma treatment process with reference to FIG. 10 may be performed on the diffusion barrier film 225 before forming the first aluminum layer 229. Alternatively, the adhesive metal layer 122 of FIG. 3 may be formed on the diffusion barrier film 225 before forming the first aluminum layer 229. Still, as another alternative, the adhesive metal layer 122 of FIG. 3 may be formed on the diffusion barrier film 225, and a process of forming the growth restraining layer 227 or the growth restraining plasma treatment process may be performed before forming the first aluminum layer 229.

Subsequently, a second aluminum layer 231 is formed on the first aluminum layer 229 using a PVD process. Therefore, throughput of an upper conductor including the first and second aluminum layers 229 and 231 may be enhanced. A reflow process may be performed on the semiconductor substrate 200. The reflow process may be performed in situ with the process of forming the second aluminum layer 231. Alternatively, the reflow process may be performed after the second aluminum layer 231 is formed. At least the second aluminum layer 231 may be reflowed by the reflow process.

Figure 14:
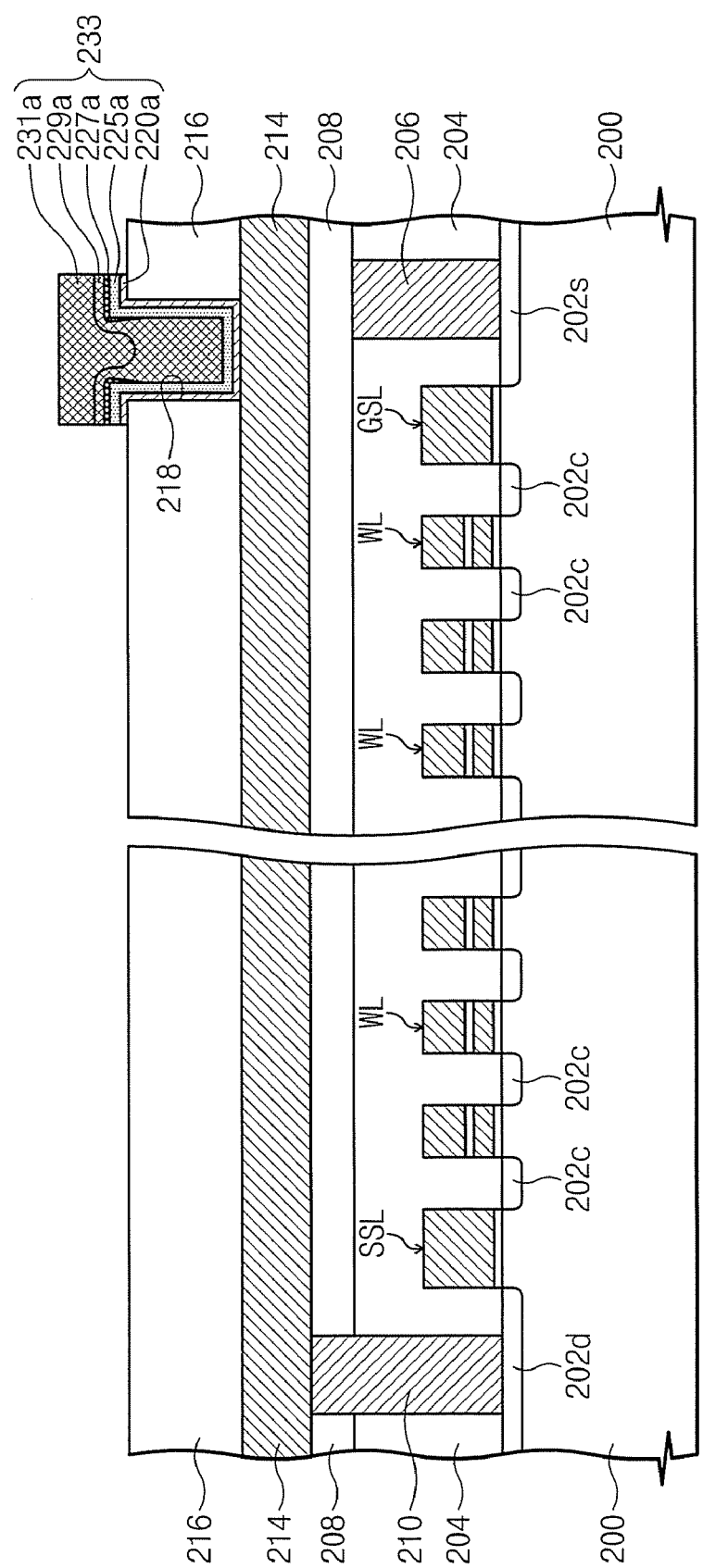

Referring to FIG. 14, the second aluminum layer 231, first aluminum layer 229, growth restraining layer 227, diffusion barrier film 225 and a supplementary diffusion barrier layer 220 may be successively patterned to form an interconnection 233. The interconnection 233 fills the opening 218, and may be formed in a line on the third interlayer insulation layer 216. The interconnection 233 includes a supplementary diffusion barrier pattern 220a, a diffusion barrier pattern 225a, a conductivity growth restraint pattern 227a, a first aluminum pattern 229a, and a second aluminum pattern 231a that are sequentially stacked.

Alternatively, the second aluminum layer 231, first aluminum layer 229, growth restraining layer 227, diffusion barrier film 225, and a supplementary diffusion barrier layer 220 may be planarized until the third interlayer insulation layer 216 is exposed, to form a conductive plug, which fills the opening 218.

As described above, embodiments of the present invention provide methods of forming a NAND non-volatile memory device, which includes a diffusion barrier film according to some embodiments of the present invention.

According to some embodiments of the present invention, the diffusion barrier film including a metal nitride made using a MOCVD process also includes one or more plasma-treated layers and one or more plasma-untreated layers. The diffusion barrier film may have a low specific resistance as well as a distinguished barrier characteristic. As a result, diffusion of metal atoms of a lower and an upper conductor under and on the diffusion barrier pattern may be minimized. Thus a semiconductor device having a distinguished electrical characteristic may be realized.

While the present invention has been particularly shown and described with reference to exemplary embodiments thereof, it will be understood by those of ordinary skill in the art that various changes in form and details may be made therein without departing from the spirit and scope of the present invention as defined by the following claims.

That which is claimed:

1. A method of forming a semiconductor device comprising:
   forming an interlayer dielectric on a substrate which includes a lower conductor;
   forming an opening that penetrates the interlayer dielectric and exposes the lower conductor;
   forming a diffusion barrier film on the substrate having the opening, the diffusion barrier film including a plasma-treated layer and a plasma-untreated layer; and
   forming an upper conductor on the diffusion barrier film to fill the opening;
   wherein forming the diffusion barrier film comprises:
   depositing a plurality of sub-metal nitride layers on the substrate, which includes the opening, wherein each of the sub-metal nitride layers is formed using a MOCVD process; and
   performing a plasma treatment to at least one selected sub-metal nitride layer among the plurality of sub-metal nitride layers after depositing the selected sub-metal nitride layer,
   wherein a first plasma treatment is performed after at least one first-selected sub-metal nitride layer among the selected sub-metal nitride layers is deposited on the substrate;
   a second plasma treatment is performed after at least one second-selected sub-metal nitride layer among the selected sub-metal nitride layers is deposited;
   the first plasma treatment is performed on an upper portion of the first-selected sub-metal nitride layer;
   the second plasma treatment is performed on at least a portion of the second-selected sub-metal nitride layer that is disposed on a bottom surface of the opening; and
   the first plasma treatment is not performed on a lower portion of the first-selected sub-metal nitride layer.

2. The method of claim 1, further comprising after at least one of the first and second selected sub-metal nitride layers is treated by the plasma treatment:
   performing a silicon soaking process on the plasma-treated sub-metal nitride layer.

3. The method of claim 1, further comprising before forming the diffusion barrier film:
   forming a supplementary diffusion barrier layer on the substrate, which includes the opening.

4. The method of claim 1, wherein the upper conductor comprises aluminum.

5. The method of claim 4, wherein forming the upper conductor comprises:
   forming a first aluminum layer on the diffusion barrier film using a CVD process; and
   forming a second aluminum layer on the first aluminum layer using a PVD process.

6. The method of claim 5, further comprising before forming the first aluminum layer:
   forming a growth restraining layer on the diffusion barrier film using a PVD process, wherein the growth restraining layer comprises a metal nitride having a nitrogen concentration higher than that of the diffusion barrier film.

7. The method of claim 5, further comprising:
   performing a reflow process on at least the second aluminum layer.

* * * * *